United States Patent
Sattigeri et al.

(10) Patent No.: US 10,489,526 B1
(45) Date of Patent: Nov. 26, 2019

(54) ADAPTIVE CONTROL FOR SIMULATOR INPUT GENERATION

(71) Applicant: Rockwell Collins, Inc., Cedar Rapids, IA (US)

(72) Inventors: Ramachandra J. Sattigeri, Ashburn, VA (US); Sami S. Mina, Reston, VA (US); Vladislav Gavrilets, McLean, VA (US); Maxime M. Gariel, Sterling, VA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 252 days.

(21) Appl. No.: 15/223,105

(22) Filed: Jul. 29, 2016

(51) Int. Cl.
*G06F 17/50* (2006.01)

(52) U.S. Cl.
CPC ...... *G06F 17/5009* (2013.01); *G06F 17/5095* (2013.01)

(58) Field of Classification Search
CPC ............. G06F 17/5009; G06F 17/5095; B60C 99/006; B60G 2600/1875; B60L 2260/30; B60T 8/1761; B60W 2050/0028; B60W 2520/00; B63B 9/001; G05B 2219/45024
USPC .......................................................... 703/8
See application file for complete search history.

(56) References Cited

U.S. PATENT DOCUMENTS

| | | | | |
|---|---|---|---|---|
| 9,296,474 B1* | 3/2016 | Nguyen | ............... | G05B 13/048 |
| 9,760,660 B2* | 9/2017 | Spira | .................. | G06F 17/5009 |
| 2012/0053916 A1* | 3/2012 | Tzidon | ..................... | G09B 9/08 |
| | | | | 703/8 |
| 2014/0207429 A1* | 7/2014 | Spira | .................. | G06F 17/5009 |
| | | | | 703/2 |
| 2015/0269860 A1* | 9/2015 | Shaw | ....................... | G09B 9/08 |
| | | | | 434/35 |
| 2017/0046968 A1* | 2/2017 | Gato | ..................... | G09B 9/206 |

OTHER PUBLICATIONS

Kasey Alan Ackerman, "Development of a pilot in the loop flight simulator using NASA's transport class model", 2014, Graduate College of the University of Illinois at Urbana-Champaign. (Year: 2014).*

* cited by examiner

*Primary Examiner* — Kamini S Shah
*Assistant Examiner* — Faraj Ayoub
(74) *Attorney, Agent, or Firm* — Suiter Swantz pc llo

(57) ABSTRACT

Systems and methods configured to adaptively control input sequences that are used to conduct qualification tests of simulators are disclosed. An input sequence may be adaptively controlled by: providing the input sequence to a simulator configured to simulate operations of a device; comparing output of the simulator to a set of recorded operation data obtained from the device; adaptively modifying the input sequence within specified bounds to produce a modified version of the input sequence to reduce one or more differences that exist between the output of the simulator and the set of recorded operation data; and providing the modified version of the input sequence to the simulator to simulate operations of the device.

20 Claims, 6 Drawing Sheets

ADAPTIVE CONTROL FOR SIMULATOR INPUT GENERATION

BACKGROUND

A flight simulation device, or a simulator, is a device that artificially re-creates aircraft flight and the environment in which it flies for pilot training, design, or other purposes. A simulator may include flight control hardware and an aircraft model containing equations that govern how aircraft fly, how aircraft react to applications of flight controls, and how aircraft react to various external factors (e.g., air density, wind shear, cloud and precipitation).

A simulator may need to demonstrate a certain level of fidelity for it to be certifiable by an aviation authority. The Federal Aviation Administration (FAA) of the United States, for example, has established Qualification Test Guide (QTG) for qualification of simulators (e.g., Federal Aviation Regulation 14 CFR Part 60). The qualification test may be carried out by comparing flight data recorded from an actual flight with modeled data generated by an aircraft model (may also be referred to as a simulator aircraft model or a simulator in general). If the same input sequence (e.g., commands issued by the pilot as recorded during the actual flight) is provided to the aircraft model, the expectation is that the modeled data produced by the aircraft model should match the recorded flight data reasonably well. It is noted, however, that minor inaccuracies in the aircraft model, simulator hardware-specific variabilities and un-modeled external disturbances such as gusts occurred during the actual flight may cause the modeled data to differ from the flight data.

To account for factors such as minor inaccuracies in the aircraft model, simulator hardware-specific variabilities and un-modeled external disturbances, the input sequence to the aircraft model is allowed to be slightly modified (from the actual commands issued by the pilot as recorded) to help demonstrate that the aircraft model can produce modeled data that matches the recorded flight data reasonably well (e.g., within QTG specified tolerances). It is noted, however, that currently available methods for modifying input sequences rely heavily on manual tuning, and thus are very time consuming and the resulting input modification is specific only to the test case being considered. In addition, currently available methods for modifying the input sequence do not take into consideration the variabilities that may be introduced by the simulator hardware. As a result, the modifications applicable to an input sequence may need to be re-tuned when the aircraft model is loaded into the simulator hardware, making the tuning process even more time consuming.

SUMMARY

In one aspect, embodiments of the inventive concepts disclosed herein are directed to a method. The method may include providing an input sequence to a simulator configured to simulate operations of a device; comparing output of the simulator to a set of recorded operation data obtained from the device; adaptively modifying the input sequence within specified bounds to produce a modified version of the input sequence to reduce one or more differences that exist between the output of the simulator and the set of recorded operation data; and providing the modified version of the input sequence to the simulator to simulate operations of the device.

In a further aspect, embodiments of the inventive concepts disclosed herein are directed an apparatus. The apparatus may include a computer-readable storage medium configured to store an input sequence to a device and operation data obtained from the device in response to the input sequence. The apparatus may also include a processor in communication with the computer-readable storage medium. The processor may be configured to: provide the input sequence stored in the computer-readable storage medium to a simulator configured to simulate operations of the device; compare output of the simulator to the operation data obtained from the device; adaptively modify the input sequence within specified bounds to produce a modified version of the input sequence to reduce one or more differences that exist between the output of the simulator and the operation data obtained from the device; and provide the modified version of the input sequence to the simulator to simulate operations of the device.

In another aspect, embodiments of the inventive concepts disclosed herein are directed to a system. The system may include a simulator configured to simulate operations of a device. The system may also include a computer-readable storage medium configured to store an input sequence to the device and operation data obtained from the device in response to the input sequence. The system may further include a processor in communication with the computer-readable storage medium. The process may be configured to: provide the input sequence stored in the computer-readable storage medium to the simulator; compare output of the simulator to the operation data obtained from the device; adaptively modify the input sequence within specified bounds to produce a modified version of the input sequence to reduce one or more differences that exist between the output of the simulator and the operation data obtained from the device; and provide the modified version of the input sequence to the simulator to simulate operations of the device.

It is to be understood that both the foregoing general description and the following detailed description are exemplary and explanatory only and are not restrictive of the inventive concepts disclosed and claimed herein. The accompanying drawings, which are incorporated in and constitute a part of the specification, illustrate embodiments of the inventive concepts and together with the general description, serve to explain the principles and features of the inventive concepts disclosed herein.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
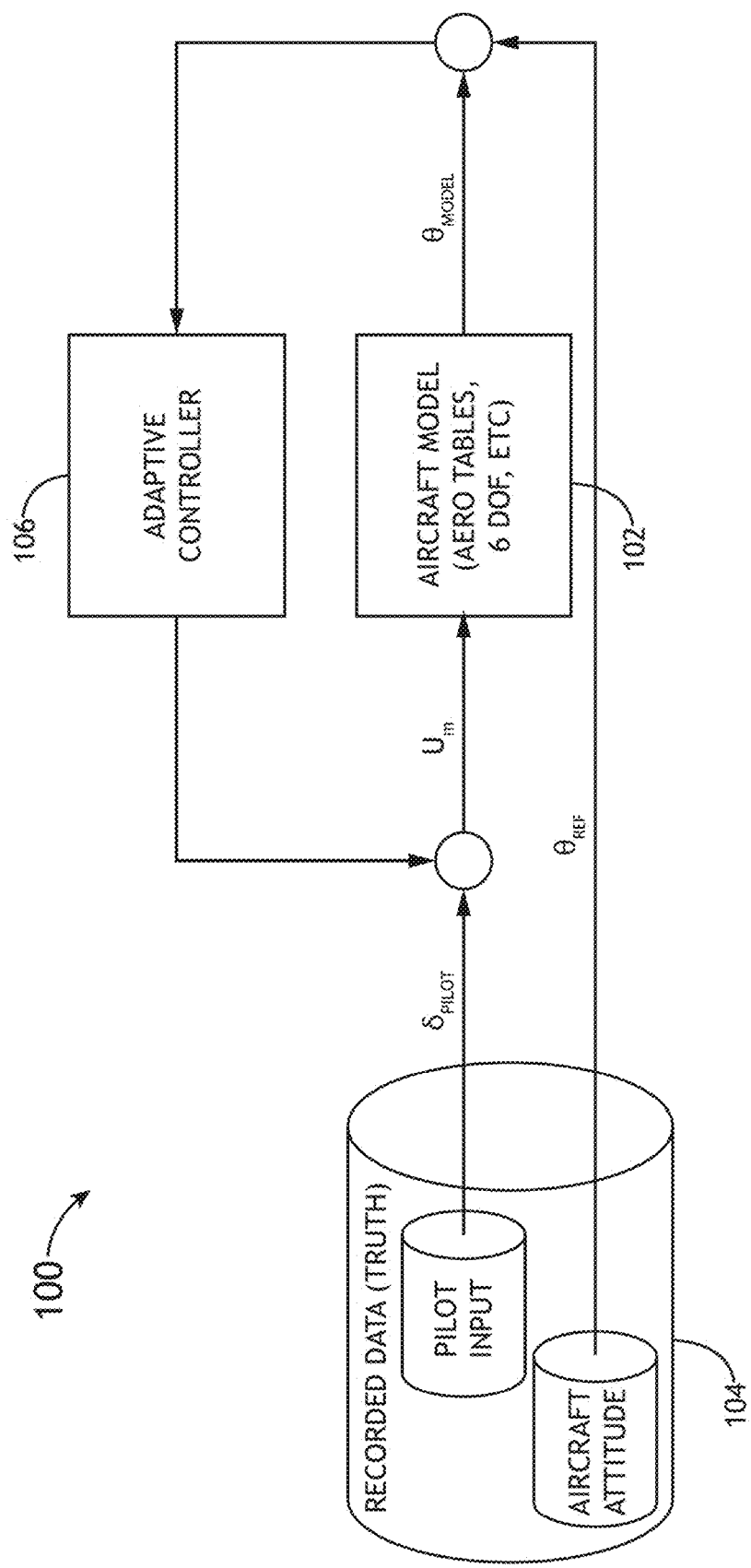
FIG. 1 is a block diagram depicting an exemplary system configured to adaptively control an input sequence according to an exemplary embodiment of the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Reference will now be made in detail to exemplary embodiments of the inventive concepts disclosed herein, examples of which are illustrated in the accompanying drawings.

Embodiments of the inventive concepts disclosed herein are directed to systems and methods configured to adaptively control input sequences that are used to conduct qualification tests of simulators. Systems and methods configured in accordance with embodiments of the inventive concepts disclosed herein can eliminate or significantly reduce the reliance on manual tuning of the input sequences. Instead, systems and methods configured in accordance with embodiments of the inventive concepts disclosed herein may rely on real-time, online generation of control inputs for each control channel, which may be utilized to augment input sequences to aircraft models to help minimize and/or reduce errors that may exist between the output of the aircraft models and the recorded flight data.

Figure 2:
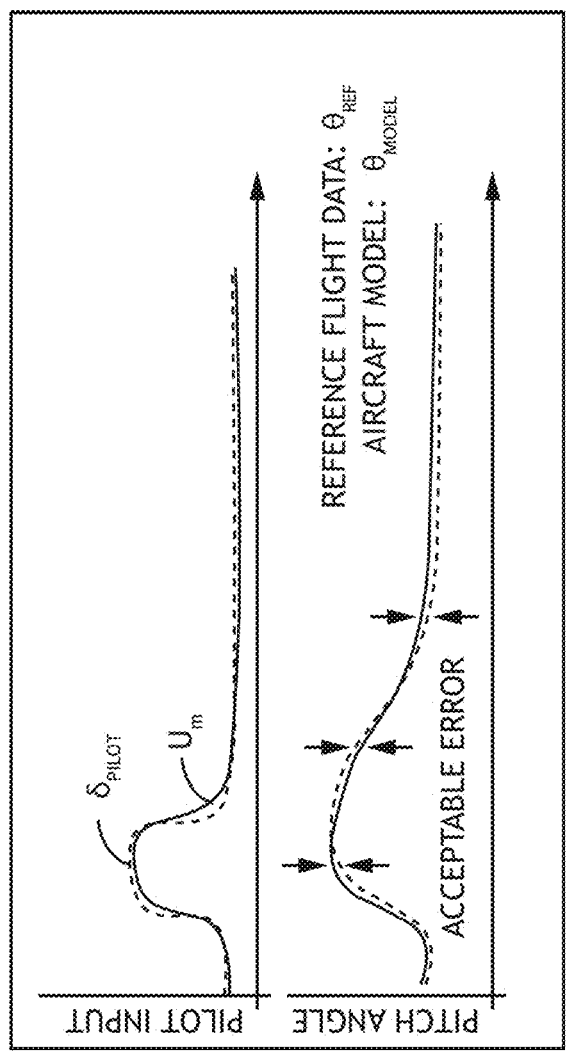
FIG. 2 is an illustration depicting an exemplary result obtained using the exemplary system depicted in FIG. 1.

Referring generally to FIGS. 1 and 2, FIG. 1 is a block diagram depicting an exemplary system 100 configured to adaptively control an input sequence $\beta_{pilot}$ and FIG. 2 is an illustration depicting an exemplary result obtained using the system 100. More specifically, as shown in FIG. 1, the system 100 may include an aircraft model 102 and a computer-readable storage medium 104. The computer-readable storage medium 104 (e.g., a memory or a database) may be configured to store data recorded/collected from one or more actual flights. The recorded data may include, for example, the pilot input data $\delta_{pilot}$ and the aircraft flight data Θref. It is to be understood that the aircraft flight data Θref recorded in the computer-readable storage medium 104 may include various types of data related to the flight of the aircraft. For purposes of presentation simplicity, however, only the aircraft attitude data is depicted in the figures.

Figure 3:
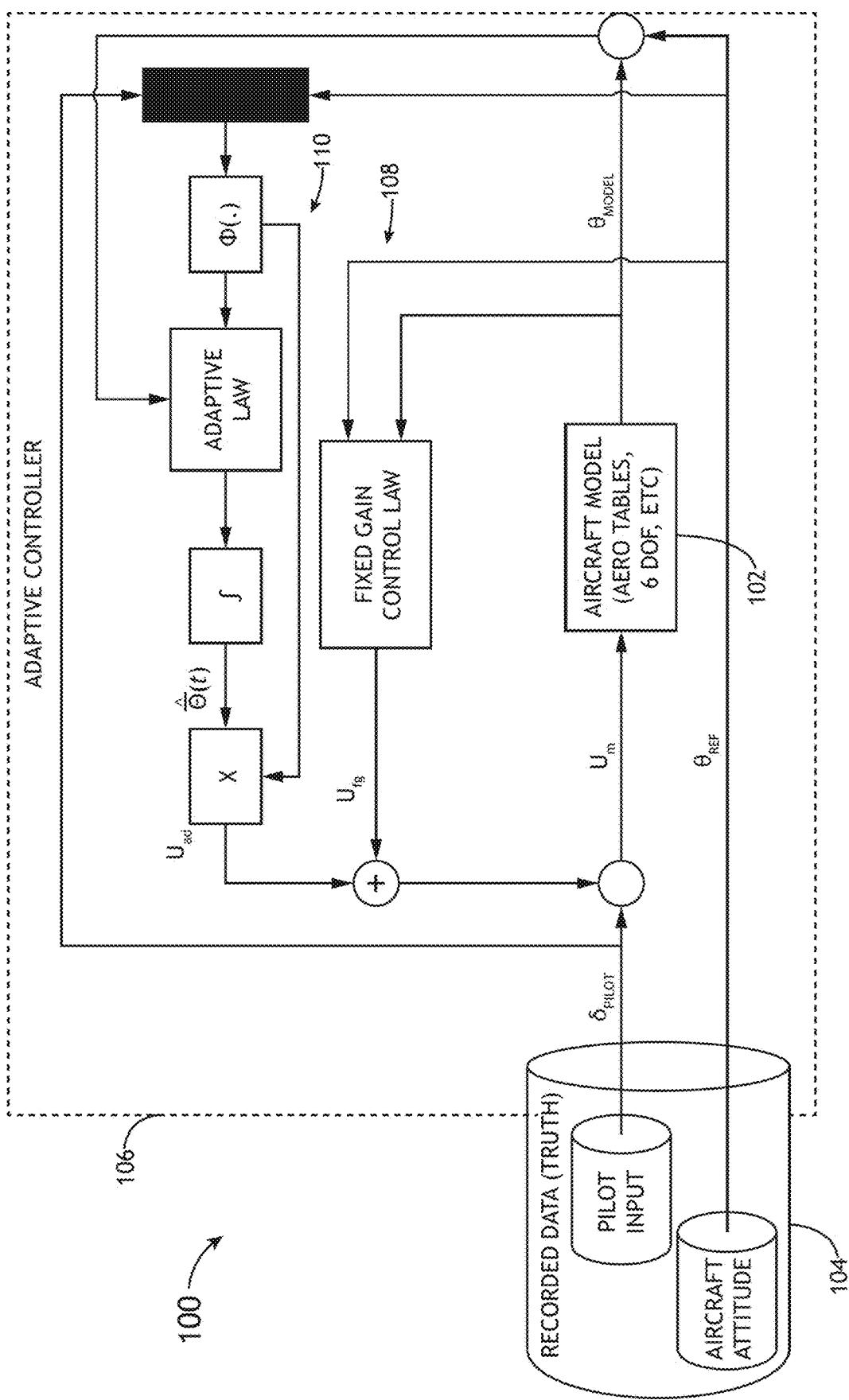
FIG. 3 is a block diagram depicting an exemplary implementation of an adaptive controller utilized in an exemplary system configured according to an exemplary embodiment of the inventive concepts disclosed herein.

The aircraft model 102 may be the subject under test (e.g., the simulator qualification test required by the FAA), which may require the system 100 to feed the recorded pilot input $\delta_{pilot}$ as input to the aircraft model 102 to verify if the modeled data output Θmodel of the aircraft model 102 (e.g., the modeled aircraft attitude data) can match the recorded flight data Θref (e.g., the recorded aircraft attitude data) reasonably well. It is noted, however, that factors such as minor inaccuracies in the aircraft model 102, simulator hardware-specific variabilities and un-modeled external disturbances and the like may cause the modeled data Θmodel to differ from the recorded flight data Θref. To account for such factors, an adaptive controller 106 (as shown in FIGS. 1 and 3) may be utilized in accordance with embodiments of the inventive concepts disclosed herein to adaptively modify the pilot input $\delta_{pilot}$ to produce a modified version of the pilot input $u_m$. The modified version of the pilot input $u_m$ may provide the aircraft model 102 the abilities to produce modeled data Θmodel that can match the recorded flight data Θref reasonably well (e.g., with errors minimized or reduced to acceptable/predetermined levels), as shown in FIG. 2.

FIG. 3 is a block diagram depicting an exemplary implementation of the adaptive controller 106. In some embodiments, the adaptive controller 106 may be implemented as a stand-alone component (which may include dedicated processing units, application-specific integrated circuits (ASICs), field-programmable gate arrays (FPGAs) or various other types of processors or processing units). Alternatively, the adaptive controller 106 may be implemented as an integrated component of the aircraft model 102 (or the simulator in general) without departing from the broad scope of the inventive concepts disclosed herein.

The adaptive controller 106 may include a fixed-gain control path 108 and an adaptive control path 110 configured to jointly provide an adaptive control solution to the input modification problem (modification of $\delta_{pilot}$ to produce $u_m$). It is noted that the adaptive control solution implemented by the adaptive controller 106 may be different from traditional adaptive control designs because the adaptive controller 106 is configured to modify a sequence of inputs to the aircraft model 102 for the model to match actual flight data while the goal of a traditional adaptive control design is for the actual aircraft to have a response to inputs matching a model. It is also noted that there is no guarantee that the actual aircraft dynamics and consequently the reference dynamics are stable, which means that the adaptive controller 106 may implement an adaptive control solution that is different from traditional adaptive control designs.

The input modification problem and the adaptive control solution provided by the adaptive controller 106 will now be described in details with reference to FIG. 3. It is to be understood that the following descriptions of the input modification problem and the adaptive control solution are presented merely for illustrative purposes and are not meant to be limiting. It is contemplated that the input modification problem and the adaptive control solution may be defined differently from the following descriptions without departing from the broad scope of the inventive concepts disclosed herein.

As a way of illustration, the first step in the development of the adaptive control solution is to define the error that the adaptive controller 106 is meant to minimize/reduce. To help achieve this, the true system dynamics (representing the actual aircraft dynamics of interest) and a model of the same (the model dynamics) may be defined.

Let the nonlinear aircraft dynamics of interest be defined as follows:

$$\dot{x}=f(x,u)+w(t) \qquad (1)$$

where x is a n×1 state vector, u is a m×1 control vector, w(t) is a time-varying, bounded disturbance vector (representing effects of, e.g., turbulences, gusts, and aircraft tail number specific hardware non-linearities), and f(x,u) is a nonlinear continuous function representing system dynamics.

In flight dynamics, it is common to decouple the longitudinal and lateral dynamics on account of symmetry and analyze the dynamics at an operating condition, such as steady-level flight. Operating conditions are obtained by trimming the dynamics at a desired airspeed and aircraft orientation (the time-varying disturbance is set to 0 for trim). The nonlinear dynamics in equation (1) may therefore be represented via a Taylor series expansion at a specific operating condition $(x_e, u_e)$ by:

$$\Delta\dot{x}=A\Delta x+B\Delta u+H.O.T(\Delta x, \Delta u) \qquad (2)$$

where $$A = \frac{\partial f}{\partial x}\bigg|_{x=x_e}, B = \frac{\partial f}{\partial u}\bigg|_{x=x_e}$$

and H.O.T represents second and higher-order terms in the perturbation variables $\Delta x=x-x_e$, $\Delta u=u-u_e$.

It is assumed that the matrices (A,B) are known and constant and the pair (A,B) is controllable, which is standard for flight control problems and is not restrictive in any practical sense. The matrices (A,B) may be obtained using a number of techniques including physics based modeling, wind-tunnel data, aerodynamic databases, and system identification techniques.

Following equation (2), the true system dynamics in equation (1) can be re-written in terms of the perturbed variables (dropping the prefix $\Delta$ for simplicity) by:

$$\dot{x}=Ax+B\Lambda(u+F(x))+w(t) \qquad (3)$$

where $\Lambda$ is a m×m unknown matrix, the pair (A,B) is controllable, the function $F(\bullet)$ is an unknown continuous function representing the second and higher-order nonlinearities in the aircraft dynamics, and w(t) is a time-varying, uniformly bounded disturbance vector (e.g., representing effect of turbulences and gusts) such that $\|w(t)\| \le w_{max}$ over time.

It can be assumed that the matrix $\Lambda$ is a constant diagonal matrix, unknown and positive definite $\Lambda>0$. It is noted that this assumption is made primarily for simplicity and it basically states that the uncertainty in control effectiveness matrix B around an operating condition is constant. It is noted that the slowly varying $\Lambda$ can be adequately handled by the methods disclosed herein.

It is further noted that the positive definiteness assumption on $\Lambda$ basically implies no loss of controllability (no diagonal terms=0). This is always the case as long as $\Lambda$ is invertible and knowledge of the sign of control effectiveness is known (e.g., positive aileron provides right roll and positive elevator provides pitch down). In general, it can therefore be assumed that the diagonal elements of $\Lambda$ are non-zero with known signs but unknown magnitudes. In other words, there is no unmodeled control reversal.

It can also be assumed that the function $F(\bullet)$ can represent the uncertainty in the true system dynamics and can be denoted as "matched uncertainty" in robust and adaptive control literature as these uncertainties enter the system dynamics through the control channels. As long as $\Lambda$ is invertible, the matched uncertainty assumption implies existence of at least one control solution capable of steering the system state along desired trajectories.

It can be further assumed that the state vector x of the system to be controlled is available for feedback. It is noted that this assumption is not restrictive for the simulator qualification test. It is also noted that the availability of full state feedback is not required/assumed. It is contemplated that the adaptive controller 106 may be expanded to an output feedback formulation (e.g., to estimate states that are not measured) if needed, and any residual measurement noise in states that are fed back (e.g., pitch-rate and/or lateral acceleration) after application of filtering can be treated in the analysis by lumping them with the time-varying environmental disturbances.

Now, with the knowledge of the (A,B) matrices, the simulator aircraft model 102 can be constructed in terms of perturbed states as follows:

$$\dot{x}_m=Ax_m+Bu_m \qquad (4)$$

where $x_m$ is a n×1 state vector and $u_m$ is a m×1 control vector that match the dimensions of the true aircraft dynamics given in equation (3). It is noted that the aircraft model 102 may include a longitudinal aircraft dynamics model with 4 states $[u,\alpha,\theta,q]^T$ and/or a combined lateral and directional aircraft dynamics model with 4 states $[\beta,p,r,\phi]^T$. It is noted that such aircraft models are known in the field of flight dynamics and the details of such models may therefore be omitted.

With both the true system dynamics and the simulator model dynamics defined, the error dynamics (which is the error the adaptive controller 106 is configured to minimize/reduce) may be defined as follows:

$$\tilde{x} \equiv x - x_m \quad (5)$$

Differentiating equation (5), and setting $u = u_m = \delta_{pilot}$, the nominal error dynamics can be obtained from equation (3) and equation (4) as:

$$\dot{\tilde{x}} = A\tilde{x} + B(\Lambda - I)\delta_{pilot} + B\Lambda F(x) + w(t) \quad (6)$$

It noted that the terms $B(\Lambda - I)\delta_{pilot} + B\Lambda F(x) + w(t)$ act as unmodeled input disturbances on the error and may lead to the difference between actual aircraft flight data $\Theta$ref and the modeled data output $\Theta$model. The problem formulation can thus be defined as: adjust or update the pilot input $\delta_{pilot}$ to produce a modified version of the pilot input $u_m$ to the aircraft model 102 such that it drives the error down to acceptably lower bounds in some finite time T>0 ($\|\tilde{x}(t)\| \leq \tilde{x}_{max}$, fort t≥T>0) while maintaining the augmented control input $u_c$ within specified bounds. Such a definition is referred to as Uniform Ultimate Boundedness (UUB) in nonlinear stability analysis literature.

More specifically, the modified pilot input $u_m$ may be defined as follows:

$$u_m = \delta_{pilot} - u_c \quad (7)$$

where $u_c$ is the compensatory control signal. Substituting for $u_m$ in equation (4) and re-writing the tracking error dynamics, the following equation is obtained:

$$\dot{\tilde{x}} = A\tilde{x} + B(\Lambda - I)\delta_{pilot} + Bu_c + B\Lambda F(x) + w(t) \quad (8)$$

Since (A,B) is controllable, $u_c$ can be selected as:

$$u_c = u_{fg} + w_{ad} \quad (9)$$

where $u_{fg} = K_x(x, x_m)$ is a fixed-gain control law (that corresponds to the fixed-gain control path 108) that is a function of the aircraft flight data state vector x and the corresponding simulator model state vector $x_m$ and where $u_{ad}$ is an adaptive control law (that corresponds to the adaptive control path 110) that is designed to compensate for the unmodeled input disturbances. The input disturbance $F(x\delta_{pilot}) = (\Lambda - I)\delta_{pilot} \Lambda F(x)$ may then be parameterized as $$F(x, \delta_{pilot}) = \bar{\Theta}^T \Phi(x, \delta_{pilot}) + \varepsilon(x, \delta_{pilot}) \quad (10)$$

where $\bar{\Theta}$ is a N×m constant matrix of unknown coefficients, $\Phi(\cdot)$ is a N×1 known regressor vector (also referred to as basis function vector below), and $\varepsilon(\cdot)$ is a function approximation error that can be made arbitrarily small, that is, $\|\varepsilon(\cdot)\| \leq \varepsilon_0$.

Following equation (10), the following form of the adaptive control law can be specified:

$$u_{ad} = \hat{\Theta}^T(t)\Phi(x, \delta_{pilot}) \quad (11)$$

where $\hat{\Theta}^T(t)$ are time-varying adaptive parameters that can be solved for by mechanization of adaptive parameter update laws constructed following Lyapunov-based stability analysis techniques.

With $u_{fg}$ and $u_{ad}$ determined, the modified version of the pilot input $u_m$ may be determined accordingly (e.g., based on equation (7), or $u_m = \delta_{pilot} - u_c$), which may then be provided as the input to the aircraft model 102. As will be appreciated from the above, using the modified version of the pilot input $u_m$ may allow the aircraft model 102 to produce modeled data $\Theta$model that can match the recorded flight data $\Theta$ref reasonably well, which may help the aircraft model 102 demonstrate its fidelity.

Figure 4:
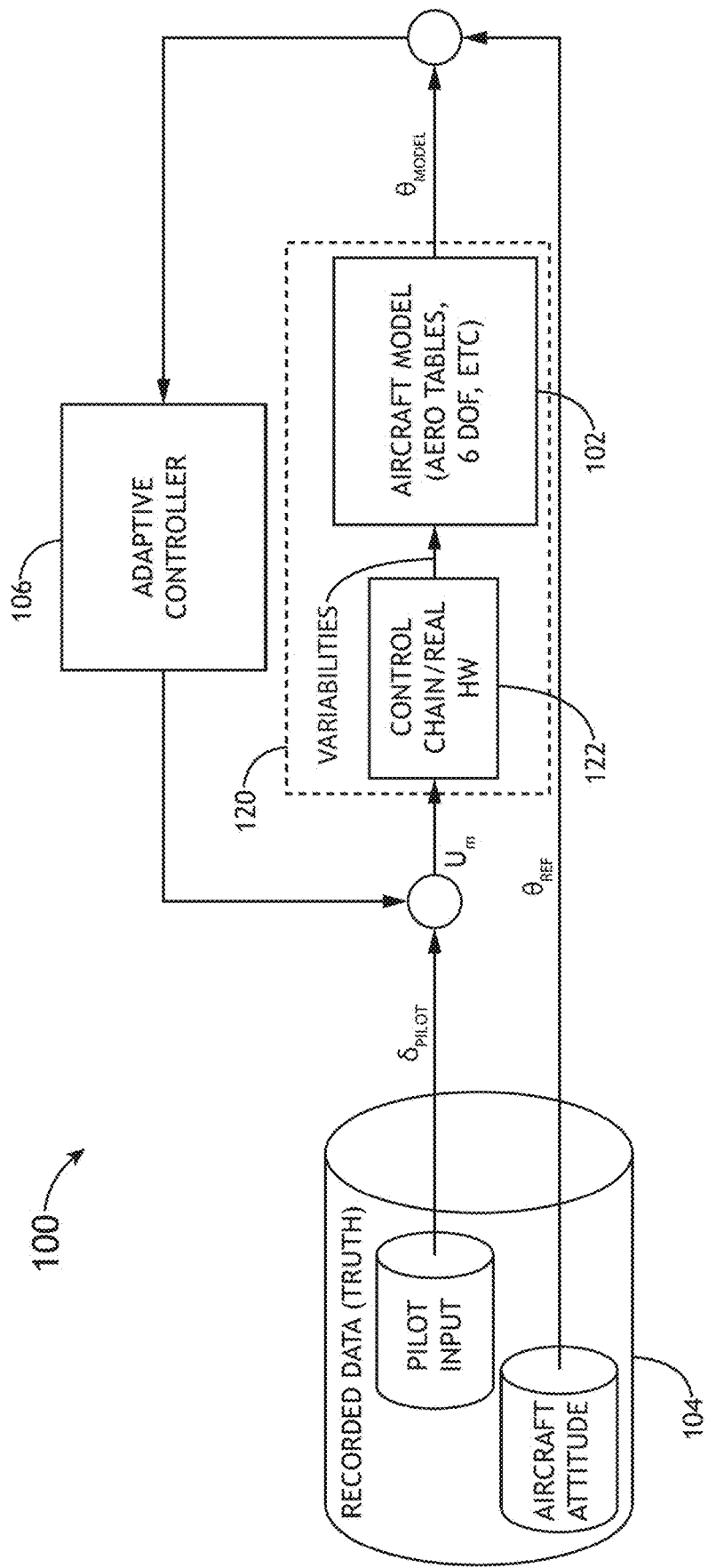
FIG. 4 is a block diagram depicting an exemplary system configured to adaptively control an input sequence according to another exemplary embodiment of the inventive concepts disclosed herein.
Figure 5:
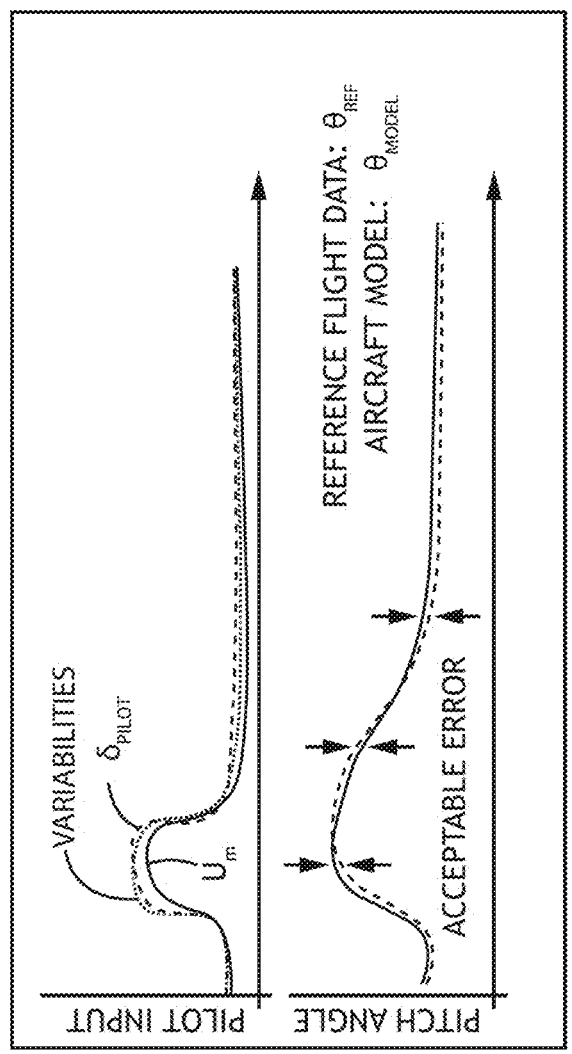
FIG. 5 is an illustration depicting an exemplary result obtained using the exemplary system depicted in FIG. 4.

It is contemplated that the adaptive controller 106 configured in accordance with embodiments of the inventive concepts disclosed herein may be useful for testing of the aircraft model 102, or for testing of simulators with aircraft models 102 installed. FIG. 4 is a block diagram depicting an adaptive controller 106 configured to adaptively control the input sequence $\delta_{pilot}$ to a simulator 120 with an aircraft model 102 installed. An illustration depicting an exemplary result obtained using the adaptive controller 106 is shown in FIG. 5.

More specifically, it is noted that the adaptive controller 106 shown in FIG. 4 may function similarly as the adaptive controller 106 shown in FIG. 1. It is noted that while the hardware 122 utilized by the simulator 120 may introduce some variabilities (e.g., the flight control hardware provided by the simulator 120 may introduce some variabilities compared to the actual flight deck hardware), such variabilities may be automatically taken into consideration by the adaptive controller 106 described above. As a result, no manual re-tuning is needed when the aircraft model 102 is loaded into the simulator 120, providing a feature that may be appreciated for various reasons.

It is to be understood that while aircraft models 102 and aircraft simulators 120 are described in the examples above, they are described merely for illustrative purposes and are not meant to be limiting. It is contemplated that the adaptive controller 106 configured in accordance with embodiments of the inventive concepts disclosed herein may be adapted to provide adaptive control of input to various other types of simulators without departing from the broad scope of the inventive concepts disclosed herein. Such simulators may include, for example, ground vehicle simulators, maritime vehicle simulators, airborne vehicle simulators, space vehicle simulators and the like.

Figure 6:
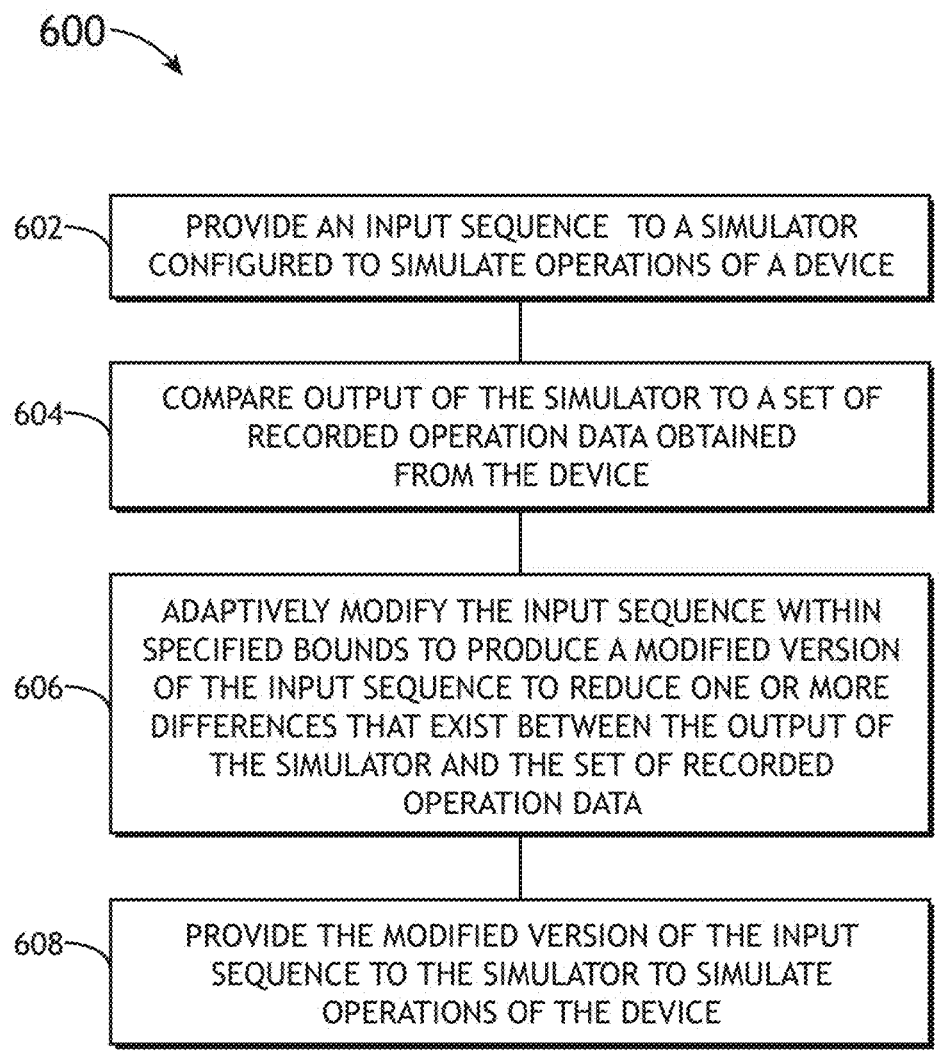
FIG. 6 is a flow diagram depicting an exemplary method configured for providing adaptive control of simulator input according to an exemplary embodiment of the inventive concepts disclosed herein.

Referring now to FIG. 6, a flow diagram depicting an exemplary method 600 configured for providing adaptive control of simulator input in accordance with an embodiment of the inventive concepts disclosed herein is shown. The method 600 may provide an input sequence (e.g., the pilot input $\delta_{pilot}$ described in the examples above) to a simulator configured to simulate operations of a device (e.g., simulate the flight of an aircraft) in a step 602. The output of the simulator may be generated in a step 604 and compared in real-time against a set of recorded operation data obtained from the device. An adaptive control step 606 may be utilized to adaptively control/modify the input sequence within specified bounds to produce a modified version of the input sequence ($u_m$) to help minimize and/or reduce any differences that may exist between the output of the simulator and the recorded operation data. It is contemplated that the adaptive control step 606 may be carried out as described above, and the modified version of the input sequence ($u_m$) may be provided to the simulator for subsequent simulations in a step 608.

It is to be understood that while the steps 602-608 are shown separately in the flow diagram presented in FIG. 6, the separations between the steps 602-608 are merely for illustrative purposes and are not meant to be limiting. It is contemplated that the method 600 may be performed recursively and in real-time. In other words, the steps 602-608 may all occur in sequence within a single time step of the simulation. Once step 608 ends, the method 600 loops back to 602 and repeats the sequence for the next time step.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

It is believed that the inventive concepts disclosed herein and many of their attendant advantages will be understood by the foregoing description, and it will be apparent that various changes may be made in the form, construction, and arrangement of the components thereof without departing from the broad scope of the inventive concepts or without sacrificing all of their material advantages. The form herein before described being merely an explanatory embodiment thereof, it is the intention of the following claims to encompass and include such changes.

What is claimed is:

1. A method, comprising:
   providing a recorded input sequence ($\delta_{input}$) including one or more recorded input commands to a simulator configured to simulate operations of a device with a device model, the recorded input sequence ($\delta_{input}$) including the one or more recorded input commands recorded during actual operation of the device at a first time;
   comparing output of the simulator to a set of recorded operation data recorded during the operation of the device at the first time;
   adaptively modifying, at a second time subsequent to the first time, one or more recorded input commands of the recorded input sequence ($\delta_{input}$) with a compensatory control signal ($u_c$) maintained within specified bounds to produce a modified version of the recorded input sequence ($u_m$) to reduce one or more differences that exist between the output of the simulator and the set of recorded operation data, the modified version of the recorded input sequence ($u_m$) defined as $u_m = \delta_{input} - u_c$;
   providing the modified version of the recorded input sequence ($u_m$) to the simulator; and
   configuring the simulator based on the modified version of the recorded input sequence ($u_m$) to reduce inaccuracies in at least one of the device model, simulator hardware-specific variabilities, or un-modeled external disturbances while simulating operations of the device.

2. The method of claim 1, wherein the device is an aircraft.

3. The method of claim 2, wherein the operations of the device comprises flight of the aircraft.

4. The method of claim 3, wherein the device model comprises an aircraft model and the output of the simulator comprises output of the aircraft model in response to the recorded input sequence ($\delta_{input}$).

5. The method of claim 4, wherein the aircraft model comprises a longitudinal aircraft dynamics model and a combined lateral and directional aircraft dynamics model.

6. The method of claim 4, wherein the recorded input sequence ($\delta_{input}$) is adaptively modified to reduce the one or more differences between the output of the simulator and the set of recorded operation data to be below a predetermined level.

7. An apparatus, comprising:
   at least one computer-readable storage medium configured to store a recorded input sequence ($\delta_{input}$) including one or more recorded input commands to a device and recorded operation data obtained from the device in response to the recorded input sequence ($\delta_{input}$), the recorded input sequence ($\delta_{input}$) including the one or more recorded input commands and the recorded operation data recorded during actual operation of the device at a first time; and
   at least one processor in communication with the at least one computer-readable storage medium, the at least one processor configured to:
      provide the recorded input sequence ($\delta_{input}$) stored in the at least one computer-readable storage medium to a simulator configured to simulate operations of the device with a device model;
      compare output of the simulator to the recorded operation data obtained from the device;
      adaptively modify, at a second time subsequent to the first time, one or more recorded input commands of the recorded input sequence ($\delta_{input}$) with a compensatory control signal ($u_c$) maintained within specified bounds to produce a modified version of the recorded input sequence ($u_m$) to reduce one or more differences that exist between the output of the simulator and the recorded operation data obtained from the device, the modified version of the recorded input sequence ($u_m$) defined as $u_m = \delta_{input} - u_c$;
      provide the modified version of the recorded input sequence ($u_m$) to the simulator; and
      configure the simulator based on the modified version of the recorded input sequence ($u_m$) to reduce inaccuracies in at least one of the device model, simulator hardware-specific variabilities, or un-modeled external disturbances while simulating operations of the device.

8. The apparatus of claim 7, wherein the device is an aircraft.

9. The apparatus of claim 8, wherein the operations of the device comprises flight of the aircraft.

10. The apparatus of claim 9, wherein the device model comprises an aircraft model and the output of the simulator comprises output of the aircraft model in response to the recorded input sequence ($\delta_{input}$).

11. The apparatus of claim 10, wherein the aircraft model comprises a longitudinal aircraft dynamics model and a combined lateral and directional aircraft dynamics model.

12. The apparatus of claim 9, wherein the recorded input sequence ($\delta_{input}$) is adaptively modified to reduce the one or more differences between the output of the simulator and the recorded operation data obtained from the device to be below a predetermined level.

13. The apparatus of claim 10, wherein the at least one processor is configured to implement: 1) a fixed-gain control law that is a function of a first state vector corresponding to the recorded operation data obtained from the device and a second state vector corresponding to the aircraft model, and 2) an adaptive control law that is designed to compensate for one or more unmodeled input disturbances.

14. A system, comprising:
   a simulator configured to simulate operations of a device with a device model;
   at least one computer-readable storage medium configured to store a recorded input sequence ($\delta_{input}$) including one or more recorded input commands to the device and recorded operation data obtained from the device in response to the recorded input sequence ($\delta_{input}$), the recorded input sequence ($\delta_{input}$) including the one or more recorded input commands and the recorded operation data recorded during actual operation of the device at a first time; and at least one processor in communication with the at least one computer-readable storage medium, the at least one processor configured to:
provide the recorded input sequence ($\delta_{input}$) stored in the at least one computer-readable storage medium to the simulator;
compare output of the simulator to the recorded operation data obtained from the device;
adaptively modify, at a second time subsequent to the first time, one or more recorded input commands of the recorded input sequence ($\delta_{input}$) with a compensatory control signal ($u_c$) maintained within specified bounds to produce a modified version of the recorded input sequence ($u_m$) to reduce one or more differences that exist between the output of the simulator and the recorded operation data obtained from the device, the modified version of the recorded input sequence ($u_m$) defined as $u_m = \delta_{input} - u_c$;
provide the modified version of the recorded input sequence ($u_m$) to the simulator; and
configure the simulator based on the modified version of the recorded input sequence ($u_m$) to reduce inaccuracies in at least one of the device model, simulator hardware-specific variabilities, or un-modeled external disturbances while simulating operations of the device.

15. The system of claim 14, wherein the device is an aircraft.

16. The system of claim 15, wherein the operations of the device comprises flight of the aircraft.

17. The system of claim 16, wherein the device model comprises an aircraft model and the output of the simulator comprises output of the aircraft model in response to the recorded input sequence ($\delta_{input}$).

18. The system of claim 17, wherein the aircraft model comprises a longitudinal aircraft dynamics model and a combined lateral and directional aircraft dynamics model.

19. The system of claim 16, wherein the recorded input sequence ($\delta_{input}$) is adaptively modified to reduce the one or more differences between the output of the simulator and the recorded operation data obtained from the device to be below a predetermined level.

20. The apparatus of claim 17, wherein the at least one processor is configured to implement: 1) a fixed-gain control law that is a function of a first state vector corresponding to the recorded operation data obtained from the device and a second state vector corresponding to the aircraft model, and 2) an adaptive control law that is designed to compensate for one or more unmodeled input disturbances.

* * * * *